United States Patent
Sudou

(10) Patent No.: US 7,236,425 B2
(45) Date of Patent: Jun. 26, 2007

(54) CHARGE PUMP CIRCUIT

(75) Inventor: Minoru Sudou, Chiba (JP)

(73) Assignee: Seiko Instruments Inc. (JP)

( * ) Notice: Subject to any disclaimer, the term of this patent is extended or adjusted under 35 U.S.C. 154(b) by 170 days.

(21) Appl. No.: 11/174,801

(22) Filed: Jul. 5, 2005

(65) Prior Publication Data

US 2006/0013047 A1    Jan. 19, 2006

(30) Foreign Application Priority Data

Jul. 16, 2004  (JP)  ............................. 2004-209810
Dec. 8, 2004   (JP)  ............................. 2004-355516
Apr. 21, 2005  (JP)  ............................. 2005-123501

(51) Int. Cl.
*G11C 8/00* (2006.01)

(52) U.S. Cl. .................. 365/233; 327/148; 327/157; 327/390; 257/299; 375/374

(58) Field of Classification Search ................ 365/233; 327/148, 157, 390; 257/299; 375/374
See application file for complete search history.

(56) References Cited

U.S. PATENT DOCUMENTS

| | | | | |
|---|---|---|---|---|
| 5,381,051 A | * | 1/1995 | Morton | ...................... 327/390 |
| 5,426,333 A | * | 6/1995 | Maeda | ...................... 327/536 |
| 6,198,340 B1 | * | 3/2001 | Ting et al. | ................... 327/536 |
| 6,650,569 B2 | * | 11/2003 | Angelica et al. | ........ 365/185.18 |
| 6,919,596 B2 | * | 7/2005 | Hara et al. | ................... 257/299 |
| 6,927,441 B2 | * | 8/2005 | Pappalardo et al. | ........ 257/299 |

* cited by examiner

*Primary Examiner*—Son Dinh
*Assistant Examiner*—Eric J. Wendler
(74) *Attorney, Agent, or Firm*—Adams & Wilks

(57) ABSTRACT

A charge pump circuit is provided which outputs a high voltage by using a boosting circuit with a smaller number of stages. A diode is used to give a back-gate voltage for a MOS transistor composing the charge pump circuit, thereby minimizing a reduction in a boosted voltage due to an increase in the threshold voltage of the MOS transistor. In addition, a second MOS transistor is provided between the back gate of the MOS transistor and the ground (GND) such that in-phase clock signals are inputted to the gate of the second MOS transistor and the capacitor thereof.

20 Claims, 5 Drawing Sheets

US 7,236,425 B2

CHARGE PUMP CIRCUIT

BACKGROUND OF THE INVENTION

1. Field of the Invention

The present invention relates to a charge pump circuit for voltage boosting.

2. Description of the Related Art

As a conventional charge pump circuit, there has been known a circuit as shown in FIG. 14 (see, e.g., JP 2718375 B (FIG. 11)).

Specifically, n-channel MOS transistors MN1 to MN5 each having the gate and drain thereof connected to each other are connected in series and capacitor elements C1 to C4 are connected individually to the respective connection points between the gates and drains of the MOS transistors MN2 to MN5. To the CLK and CLKB terminals provided at the other end of the capacitor elements, voltages VCLK and VCLKB having phases opposite to each other are inputted, as shown in FIG. 15.

Each of the gate and drain of the n-channel MOS transistor MN1 is connected to a power source VDD and an output OUT of the boosting circuit is extracted from the source of the MOS transistor MN5. A voltage at a connection point among the source of the n-channel MOS transistor MN1 and the gate and drain of the n-channel MOS transistor MN2 is assumed to be V12. When the voltage VCLK is initially in the "L", i.e., GND state, the voltage V12 is given by the expression (1):

$$V12 = VDD - Vtn1 \qquad (1).$$

Next, when the voltage VCLK comes into the "H", i.e., VDD state, the voltage V12 is given by the expression (2):

$$V12 = 2*VDD - Vtn1 \qquad (2)$$

wherein Vtn1 represents the threshold voltage of the n-channel MOS transistor MN1. A voltage at a connection point among the source of the n-channel MOS transistor MN2 and the gate and drain of the n-channel MOS transistor MN3 is assumed to be V23. When the voltage VCLK is in the "H", i.e., VDD state, the voltage V23 is given by the expression (3) (the voltage VCLKB at that time is in the "L" state):

$$V23 = 2*VDD - Vtn1 Vtn2 \qquad (3)$$

wherein Vtn2 represents the threshold voltage of the n-channel MOS transistor MN2. Next, the voltage VCLK comes into the "L" state, i.e., the voltage VCLKB comes into the VDD state. A voltage at the connection point among the source of the n-channel MOS transistor MN2 and the gate and drain of the n-channel MOS transistor MN3 is assumed to be V23. The voltage V23 is given by the expression (4):

$$V23 = 3*VDD - Vtn1 Vtn2 \qquad (4).$$

Finally, a voltage at the output terminal of the conventional charge pump circuit having a four-stage configuration shown in FIG. 13, i.e., the source voltage V5 of the n-channel MOS transistor MN5 is given by the expression (5):

$$V5 = 5*VDD - Vtn1 Vtn2 - Vtn3 - Vtn4 - Vtn5 \qquad (5)$$

wherein Vtn3, Vtn4, and Vtn5 each represent the threshold voltages of the n-channel MOS transistors MN3, MN4, and MN5, respectively.

In FIG. 14, the substrate (well) of each of the n-channel MOS transistors MN1 to MN5 is connected to the ground (GND). In that case, due to the back-gate effect, the values of the respective threshold voltages Vtn1 to Vtn5 of the n-channel MOS transistors MN1 to MN5 increases to be higher than the values of the threshold voltages in the absence of the back-gate effect. Accordingly, the voltage V5 at the output terminal, which is given by the expression (5), decreases.

SUMMARY OF THE INVENTION

The conventional charge pump circuit has had a problem in that the threshold voltages increase due to the back-gate effect exerted on the MOS transistors and the output voltage is thereby lowered. In other words, there has been a problem in that the number of stages in the boosting charge pump circuit should be increased in order to obtain a desired output voltage.

To solve the conventional problems as described above, it is therefore an object of the present invention to minimize the reduction in the output voltage of the boosting charge pump circuit by suppressing the back-gate effect on the MOS transistors, and allow a high output voltage to be obtained from the boosting charge pump circuit with a small number of stages.

To suppress the back-gate effect exerted on a MOS transistor, a charge pump circuit according to the present invention is constituted such that a potential in the well of the MOS transistor is given by a source-well parasitic diode and by a drain-well parasitic diode.

The charge pump circuit according to the present invention is also constituted such that the potential in the well of the MOS transistor is given by a source-well Schottky barrier diode and by a drain-well Schottky barrier diode.

The charge pump circuit according to the present invention is also constituted such that a resistor is provided at least between the well of the MOS transistor and an input terminal, or between the well of the MOS transistor and an output terminal.

The charge pump circuit according to the present invention is constituted such that a second MOS transistor is further provided between the well of the MOS transistor and a ground (GND), and in-phase clock signals are inputted to the gate and capacitor of the second MOS transistor.

In addition, a switch element is inserted between a boosting charge pump circuit and a load.

The boosting charge pump circuit according to the present invention has an effect of suppressing the back-gate effect on the MOS transistor by giving the potential in the well of the MOS transistor as described above, thereby allowing a high output voltage to be obtained from the boosting circuit with a small number of stages.

By switching the potential in the well of the MOS transistor by using the second MOS transistor, a backflow due to a leakage current can be suppressed.

To solve the problems described above, the boosting charge pump circuit according to the present invention is constituted such that a back-gate voltage for the MOS transistor is applied via a diode.

DETAILED DESCRIPTION OF THE PREFERRED EMBODIMENTS

Embodiment 1

Figure 1:
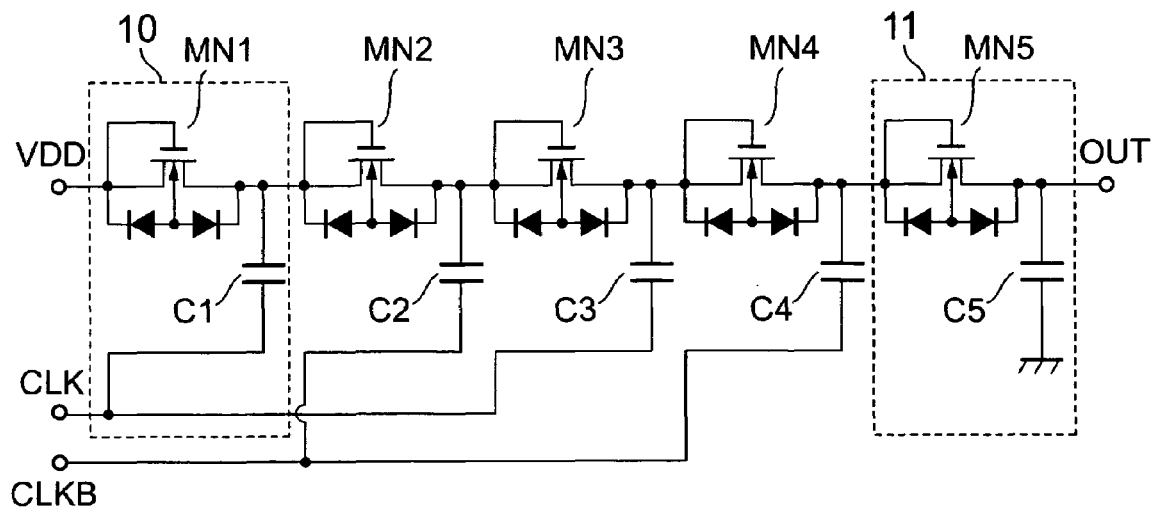
FIG. 1 is a charge pump circuit diagram according to a first embodiment of the present invention.

Referring now to the drawings, the embodiments of the present invention will be described herein below. FIG. 1 shows a boosting charge bump circuit according to a first embodiment of the present invention.

The respective voltages applied to the n-channel MOS transistors MN1 to MN5, the capacitors C1 to C5, the VDD terminal, the CLK terminal, and the CLKB terminal are equal to those applied in the conventional embodiment. The difference between the embodiments of the present invention and conventional embodiments is that the well potentials of the MOS transistors MN1 to MN5 are given by parasitic diodes. The parasitic diodes exist between the respective wells of the n-channel MOS transistors MN1 to MN5 and the respective sources and drains thereof. Specifically, a unit boosting circuit 10 is composed of an n-channel MOS transistor using the gate and drain thereof connected to each other as an input terminal and using the source thereof as an output terminal, and parasitic diodes composed of the well, source, and drain of the n-channel MOS transistor. In a boosting output circuit 11, the capacitor of the output terminal of the unit boosting circuit 10 has the other terminal thereof connected to a reference voltage (GND).

A description will be given next to a boosting operation according to the present invention. The voltage at a connection point among the source of the n-channel MOS transistor MN1 and the gate and drain of the n-channel MOS transistor MN2 is assumed to be V12. When the voltage at the CLK terminal (hereinafter referred to as VCLK) is initially in the "L", i.e., GND state, the voltage V12 is given by the expression (6) in the same manner as in the conventional embodiment:

$$V12=VDD-Vtn1 \qquad (6).$$

Here, when the voltage VCLK is in the "L" state, the well potential of the n-channel MOS transistor MN1 is determined by the parasitic diodes.

Figure 2:
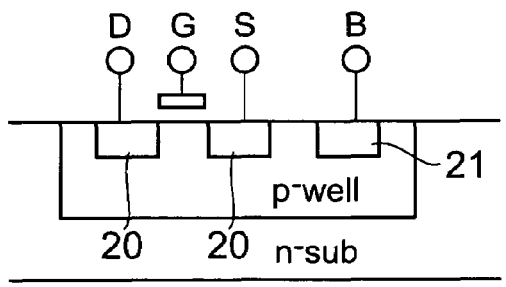
FIG. 2 shows an example of the cross-sectional structure of a MOS transistor.

FIG. 2 shows an example of the cross-sectional structure of the n-channel MOS transistor. A p-well is formed in an n-type Si substrate and an $n^+$-region 20 and a $p^+$-region 21 are formed therein. In the $n^+$-region 20, a drain and a source are formed and denoted by the terminals D and S respectively. The well is connected at the terminal B. The terminal G denotes the gate of the MOS transistor. It can be understood by referring to FIG. 2, since each of the source and the drain is of the n-type whereas the well is of the p-type, there are parasitic pn-junction diodes using the well as an anode and the source and the drain as cathodes.

When the voltage VCLK is in the "L" state, the source-side parasitic diode of the n-channel MOS transistor MN1 of FIG. 1 is turned on by a leakage current in the drain-side parasitic diode of the n-channel MOS transistor MN1, so the potential in the well has a value higher by about 0.6V than that of the source-side parasitic diode. In that case, a voltage opposite to a conventional back-gate bias (positive voltage with respect to the source) is applied, and as a result, the threshold voltage of the n-channel MOS transistor MN1 can be reduced to a value lower than the threshold voltage in the absence of the back-gate bias.

Specifically, the value of the threshold voltage Vtn1 in the expression (1) becomes smaller than in the conventional case and the voltage V12 at the connection point among the source of the n-channel MOS transistor MN1 and the gate and drain of the n-channel MOS transistor MN2 becomes higher. Next, when the voltage VCLK comes into the "H", i.e., VDD state, the voltage V12 is given by the expression (7):

$$V12=2*VDD-Vtn1 \qquad (7).$$

When the voltage VCLK is in the "H" state, the drain-side parasitic diode of the n-channel MOS transistor MN1 of FIG. 1 is turned on by a leakage current in the source-side parasitic diode of the n-channel MOS transistor MN1, so the potential in the well has a value higher by about 0.6 V than that of the drain-side parasitic diode. However, the gate and the drain are short-circuited, so the n-channel MOS transistor MN1 is not turned on. Therefore, it becomes possible to prevent a backflow from the source to the drain.

A voltage at a connection point among the source of the n-channel MOS transistor MN2 and the gate and drain of the n-channel MOS transistor MN3 is assumed to be V23. When the VCLK is in the "H", i.e., VDD state, the voltage V23 is given by the expression (8) in the same manner as in the conventional embodiment:

$$V23=2*VDD-Vtn1Vtn2 \qquad (8)$$

wherein Vtn2 represents the threshold voltage of the n-channel MOS transistor MN2. At this time, the well potential of the n-channel MOS transistor MN2 is determined by parasitic diodes in the same manner as in the n-channel MOS transistor MN1, so the threshold voltage Vtn2 of the n-channel MOS transistor MN2 has a value lower than that in the conventional embodiment. Accordingly, the voltage V23 becomes higher.

Next, the voltage VCLK comes into the "L", i.e., the voltage VCLKB comes into VDD state. When a voltage at the connection point among the source of the n-channel MOS transistor MN2 and the gate and drain of the n-channel MOS transistor MN3 is assumed to be V23, the voltage V23 is given by the expression (9):

$$V23=3*VDD-Vtn1Vtn2 \qquad (9).$$

Finally, a voltage at the output OUT of the charge pump circuit according to the present invention shown in FIG. 1, i.e., the source voltage V5 of the n-channel MOS transistor MN5 is given by the expression (10):

$$V5 = 5*VDD - Vtn1 - Vtn2 - Vtn3 - Vtn4 - Vtn5 \quad (10)$$

wherein the Vtn3, Vtn4, and Vtn5 each represent the threshold voltages of the n-channel MOS transistors MN3, MN4, and MN5, respectively.

When a comparison is made between the expressions (10) and (5), there seems to be no nominal difference therebetween. In the boosting charge pump circuit according to the present invention, however, the threshold voltages in the expression (10) is smaller than that in the expression (5) as a result of suppressing the back-gate effect. As a result, a higher boosted voltage can be obtained.

Embodiment 2

Figure 3:
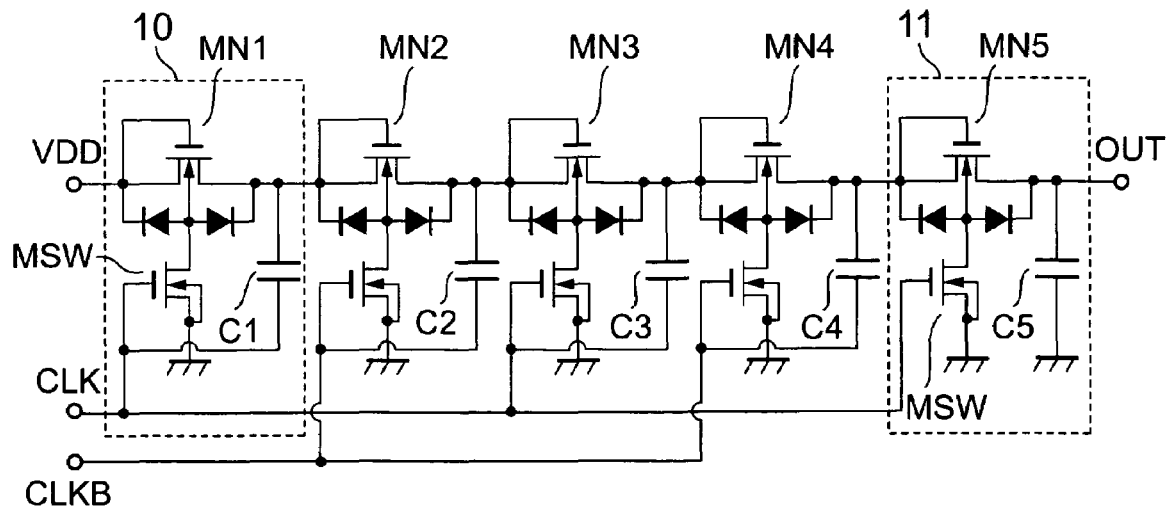
FIG. 3 is a unit boosting circuit diagram according to a second embodiment of the present invention.

FIG. 3 shows a second embodiment of the boosting charge pump circuit according to the present invention. The voltages applied respectively to the n-channel MOS transistors MN1 to MN5, the capacitors C1 to C5, the VDD terminal, the CLK terminal, and the CLKB terminal are equal to those applied in the conventional embodiment. The difference between the embodiments of the present invention and conventional embodiments is that the well potential of each of the MOS transistors MN1 to MN5 is connected to the reference voltage (GND) via a switch transistor MSW. The switch transistor MSW has the gate connected to the CLK or CLKD terminal.

Specifically, the unit boosting circuit 10 is composed of an n-channel MOS transistor using the gate and drain thereof connected to each other as an input terminal and using the source thereof as an output terminal, a capacitor connected to the output terminal, and an n-channel MOS transistor having the drain thereof connected to the well of the n-channel MOS transistor, the source thereof connected to the reference voltage (GND), and the gate thereof connected to the other terminal of the capacitor of the output terminal.

In a boosting output circuit 11, the capacitor of the output terminal of the unit boosting circuit 10 has the other terminal thereof connected to a reference voltage (GND).

Next, a description will be given to a boosting operation according to the present invention.

When the voltage VCLK comes into the "L" state, the switch transistor MSW is turned off. Therefore, the well potential of the n-channel MOS transistor MN1 is determined by parasitic diodes in the same manner as in the first embodiment (it is assumed herein that a leakage current when the n-channel MOS transistor MSW is turned off is smaller than a leakage current in each of the parasitic diodes). Accordingly, the threshold voltage of the n-channel MOS transistor MN1 becomes lower than that in the conventional embodiment, and the voltage V12 at the connection point among the gate and drain of the n-channel MOS transistor MN2 becomes higher in the same manner as in the first embodiment.

When the voltage VCLK comes into the "H" state, the n-channel MOS transistor MSW connected to the substrate of the n-channel MOS transistor MN1 is turned on, and the well potential of the n-channel MOS transistor MN1 reaches the GND level. When the voltage VCLK is in the "H" state, a backflow to the VDD terminal resulting from a leakage current in the n-channel MOS transistor MN1 can be suppressed by applying the back-gate bias and thereby increasing the threshold voltage of the n-channel MOS transistor MN1. In the first embodiment, as described above, the gate and drain are short-circuited so the n-channel MOS transistor MN1 is not turned on, whereby it becomes possible to prevent a backflow from the source to the drain. However, in the case where the threshold voltage is low and the temperature is high, there is the possibility that a backflow occurs from the source to the drain. In the second embodiment, the n-channel MOS transistor MSW is turned on to bring the potential in the well to the GND level, whereby it becomes possible to increase the threshold voltage of the n-channel MOS transistor MN1 and reliably suppress the backflow from the source to the drain.

That is, in the second embodiment, a high boosted voltage can be obtained and a backflow can be prevented reliably in the same manner as in the first embodiment.

Embodiment 3

Figure 4:
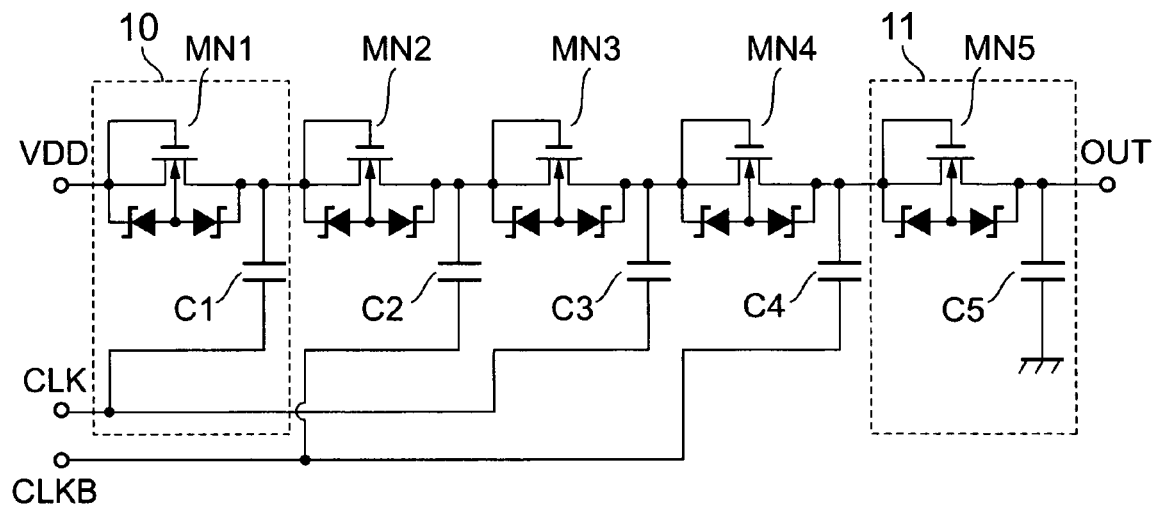
FIG. 4 is a boosting output circuit diagram according to a third embodiment of the present invention.

FIG. 4 shows a third embodiment of a boosting charge pump circuit according to the present invention.

The difference between the first and third embodiments is that diodes connected to the well, the source, and the drain are Schottky barrier diodes. To be more precise, the parasitic pn-junction diodes are present, so the Schottky barrier diodes are connected in parallel therewith.

Figure 5:
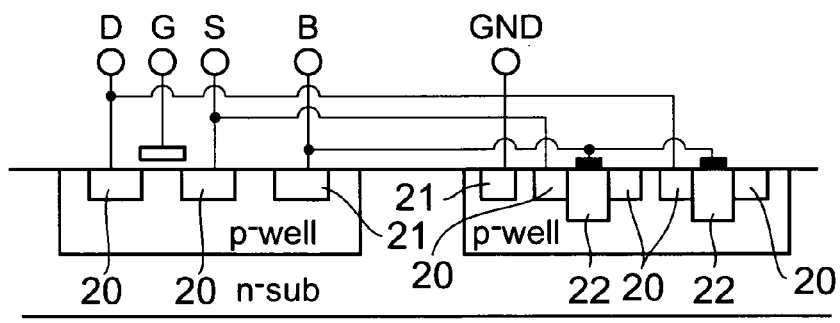
FIG. 5 shows an example of the cross-sectional structure of the MOS transistor and Schottky barrier diodes.

FIG. 5 shows an example of the cross-sectional structure of the n-channel MOS transistor and the Schottky barrier diodes. The cross-sectional structure of the n-channel MOS transistor portion is equal to that shown in FIG. 2. The Schottky barrier diodes are formed through contact between n-wells 22 formed in the p-well connected electrically to the ground GND and a metal (e.g., aluminum). In that case, the metal serves as anodes and the n-wells serve as cathodes. The anodes of the two Schottky barrier diodes are connected in common to the well terminal B of the n-channel MOS transistor. The cathodes of the two Schottky barrier diodes are connected individually to the drain terminal D and source terminal S of the n-channel MOS transistor.

In the cross-sectional structure of FIG. 2, if the pn-junction diode using the well as the anode and using the source or drain as the cathode is turned on, there are cases where a vertical bipolar transistor using the n-type Si substrate as a collector is turned on to allow a current to flow, which may lead to the worst case where voltage boosting becomes impossible.

On the other hand, by connecting the Schottky barrier diodes, which uses the well as the anodes and the source and the drain as the cathodes, between the well and the source and between the well and the drain as shown in FIG. 4, a forward voltage in each of the Schottky barrier diodes is lower than a forward voltage in each of the parasitic pn-junction diodes. Therefore, the Schottky barrier diodes are turned on prior to the parasitic pn-junction diodes, which prevents the parasitic pn-junction diodes from being turned on, and, similarly to the first embodiment, suppresses the back-gate effect on the n-channel MOS transistors, to thereby prevent an increase in threshold voltage. As a result, a boosted voltage higher than that in the conventional embodiment is obtained.

Embodiment 4

Figure 6:
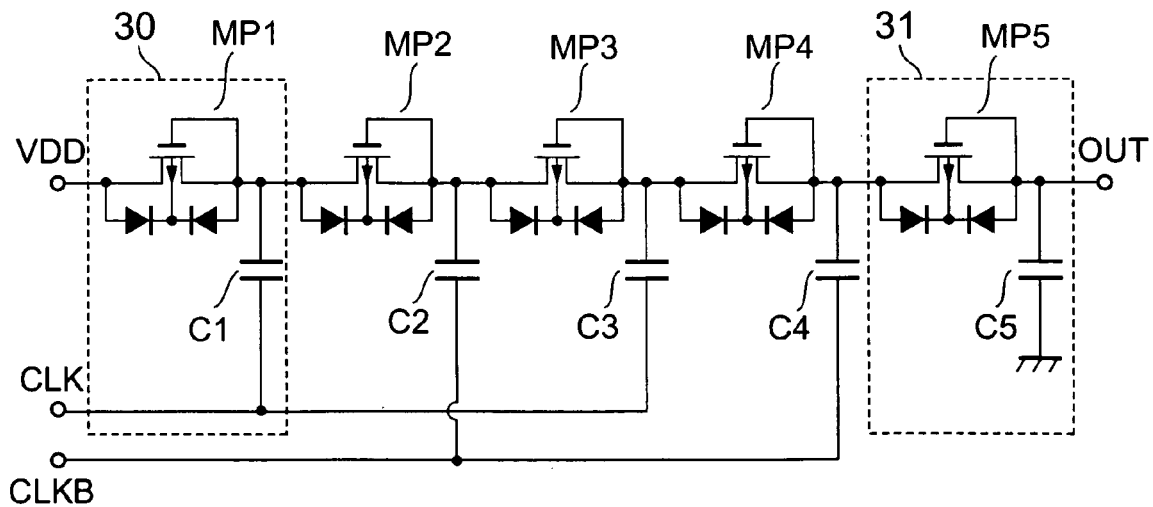
FIG. 6 is a boosting output circuit diagram according to a fourth embodiment of the present invention.

FIG. 6 is a boosting charge pump circuit according to a fourth embodiment of the present invention.

Figure 14:
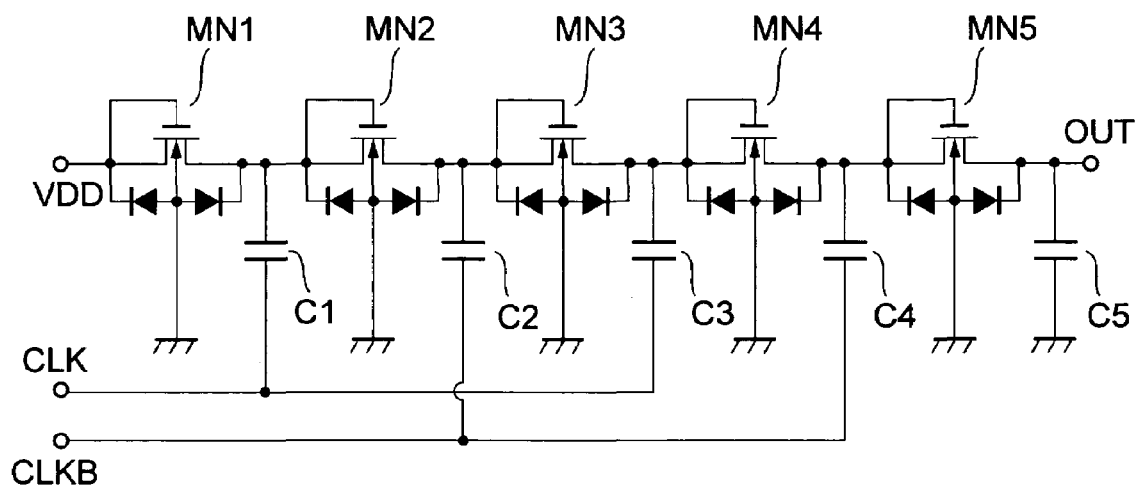
FIG. 14 is a charge pump circuit diagram according to a first conventional embodiment.

A p-channel MOS transistor MP2 having the gate and drain thereof connected to each other is connected to the source of a p-channel MOS transistor MP1 having the gate and drain thereof connected to each other. Then, the p-channel MOS transistors MP1 to MP5 are connected successively in series and capacitor elements C1 to C5 are connected individually to the connection points between the respective gates and drains of the MOS transistors. To the CLK and CLKB terminals at the other ends of the capacitor elements C1 to C4, voltages VCLK and VCLKB having phases opposite to each other are inputted in the same manner as in the conventional embodiment, as shown in FIG. 14.

The p-channel MOS transistor MP1 has the source thereof connected to the power source VDD and an output of the boosting circuit is extracted from the connection point between the gate and drain of the p-channel MOS transistor MP5.

Specifically, a unit boosting circuit 30 is composed of the p-channel MOS transistor MP1 and the capacitor C1. The p-channel MOS transistor MP1 uses the gate and drain thereof connected to each other as an output terminal and uses the source thereof as an input terminal. The capacitor C1 has one terminal connected to the output terminal and the other terminal connected to the CLK terminal.

In a boosting output circuit 31, the capacitor C5 connected to the output terminal of the unit boosting circuit 30 has the other terminal thereof connected to a reference voltage (GND).

The voltage at a connection point among the gate and drain of the n-channel MOS transistor MP1 and the source of the p-channel MOS transistor MP2 is assumed to be V12. When the voltage VLK terminal (hereinafter referred to as VCLK) is initially in the "L", i.e., GND state, the voltage V12 is given by the expression (11):

$$V12 = VDD - Vtp1 \qquad (11).$$

Here, when the voltage VCLK is in the "L" state, the well potential of the p-channel MOS transistor MP1 is determined by the parasitic diodes.

Figure 7:
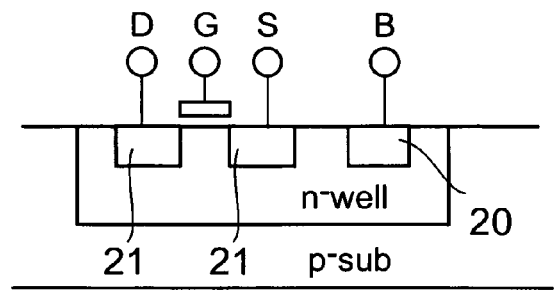
FIG. 7 shows an example of the cross-sectional structure of the MOS transistor.

FIG. 7 shows an example of the cross-sectional structure of the p-channel MOS transistor. A n-well is formed in an p-type Si substrate and an n$^+$-region 20 and a p$^+$-region 21 are formed therein. In the p$^+$-region 21, a drain and a source are formed and denoted by the terminals D and S respectively. The well is connected at the terminal B. The terminal G denotes the gate of the MOS transistor. It can be understood by referring to FIG. 7, since each of the source and the drain is of the n-type whereas the well is of the p-type, there are parasitic pn-junction diodes using the well as a cathode and the source and the drain as anodes.

When the voltage VCLK is in the "L" state, the source-side parasitic diode of the p-channel MOS transistor MP1 of FIG. 6 is turned on by a leakage current in the drain-side parasitic diode of the p-channel MOS transistor MP1, so the potential in the well has a value higher by about 0.6 V than that of the source-side parasitic diode. In that case, a voltage opposite to a conventional back-gate bias (negative voltage with respect to the source) is applied, and as a result, an absolute value of the threshold voltage of the p-channel MOS transistor MP1 can be reduced to a value lower than the threshold voltage in the absence of the back-gate bias.

Specifically, the value of the threshold voltage Vtp1 in the expression (11) becomes smaller than in the conventional case and the voltage V12 at a connection point among the gate and drain of the p-channel MOS transistor MP1 and the source of the p-channel MOS transistor MP2 becomes higher. Next, when the voltage VCLK comes into the "H", i.e., VDD state, the voltage V12 is given by the expression (12):

$$V12 = 2*VDD - Vtp1 \qquad (12)$$

wherein Vtp1 represents an absolute value of the threshold voltage of the p-channel MOS transistor MP2. A voltage at a connection point among the gate and drain of the p-channel MOS transistor MP2 and the source of the p-channel MOS transistor MP3 is assumed to be V23. When the VCLK is in the "H", i.e., VDD state, the voltage V23 is given by the expression (13):

$$V23 = 2*VDD - Vtp1Vtp2 \qquad (13)$$

wherein Vtp2 represents an absolute value of the threshold voltage of the p-channel MOS transistor MP2.

Next, the voltage VCLK comes into the "L", i.e., the voltage VCLKB comes into VDD state. When a voltage at a connection point among the gate and source of the p-channel MOS transistor MP2 and the source of the p-channel MOS transistor MP3 is assumed to be V23, the voltage V23 is given by the expression (14):

$$V23 = 3*VDD - Vtp1Vtp2 \qquad (14)$$

Finally, a voltage at the output terminal of the charge pump circuit shown in FIG. 6, i.e., the gate-drain voltage V5 of the p-channel MOS transistor MP5 is given by the expression (15):

$$V5 = 5*VDD - VtpVtp2 - Vtp3 - Vtp4 - Vtp5 \qquad (15)$$

wherein the Vtp3, Vtp4, and Vtp5 represent absolute values of the threshold voltages of the p-channel MOS transistors MP3, MP4, and MP5, respectively.

Embodiment 5

Figure 8:
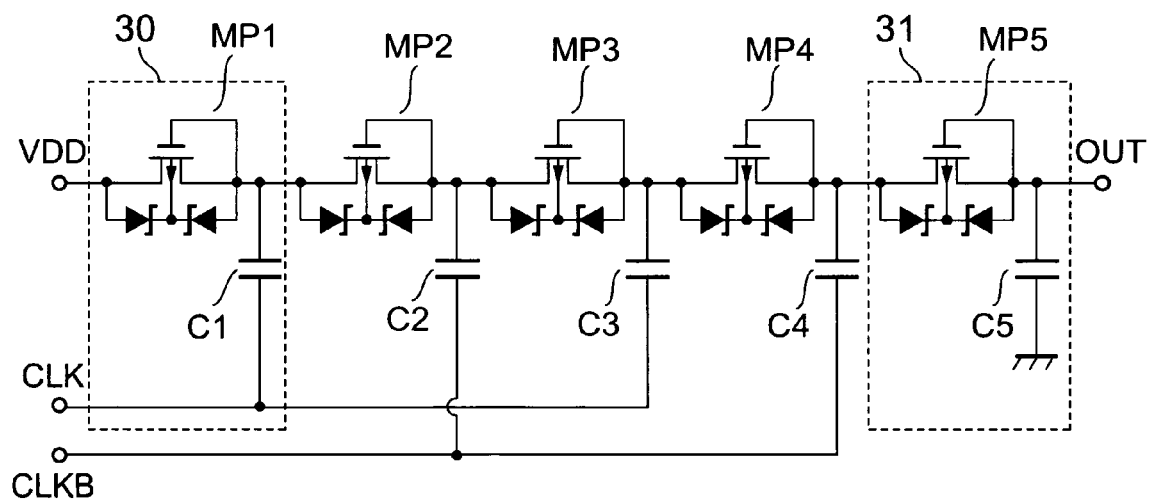
FIG. 8 is a charge pump circuit diagram according to a fifth embodiment of the present invention.

FIG. 8 shows a fifth embodiment of a boosting charge pump circuit according to the present invention. The difference between the fifth embodiment shown in FIG. 8 and fourth embodiment shown in FIG. 6 is that diodes connected to the source and drain of the p-channel MOS transistor are Schottky barrier diodes, rather than pn-junction diodes. To be more precise, the parasitic pn-junction diodes are present, so the Schottky barrier diodes are connected in parallel therewith.

Figure 9:
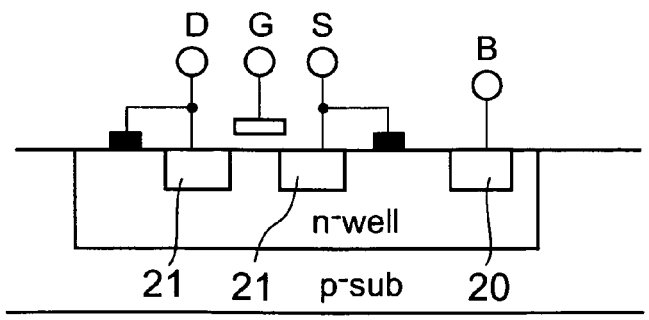
FIG. 9 shows an example of the cross-sectional structure of the MOS transistor and the Schottky barrier diodes.

FIG. 9 shows an example of the cross-sectional structure of the p-channel MOS transistor and the Schottky barrier diodes. The cross-sectional structure of the p-channel MOS transistor portion is equal to that shown in FIG. 7. The Schottky barrier diodes are formed through contact between n-wells and a metal (e.g., aluminum) In that case, the metal serves as anodes and the n-wells serve as cathodes. The anodes of the two Schottky barrier diodes are respectively connected to the source and drain of the p-channel MOS transistor, whereby the cathode is automatically connected to the n-well.

In the cross-sectional structure of FIG. 7, if the pn-junction diode using the well as the cathode and using the source or drain as the anode is turned on, there are cases where a vertical bipolar transistor using the p-type Si substrate as a collector is turned on to allow a current to flow, which may lead to the worst case where voltage boosting becomes impossible.

On the other hand, by connecting the Schottky barrier diodes, which uses the well as the cathodes and the source and the drain as the anodes, between the well and the source and between the well and the drain as shown in FIG. 9, a forward voltage in each of the Schottky barrier diodes is lower than a forward voltage in each of the parasitic pn-junction diodes. Therefore, the Schottky barrier diodes are turned on prior to the parasitic pn-junction diodes, which prevents the parasitic pn-junction diodes from being turned on and, similarly to the fourth embodiment, suppresses the back-gate effect on the n-channel MOS transistors, to thereby to prevent an increase in threshold voltage. As a result, boosted voltage higher than that in the conventional embodiment can be obtained.

Embodiment 6

Figure 10:
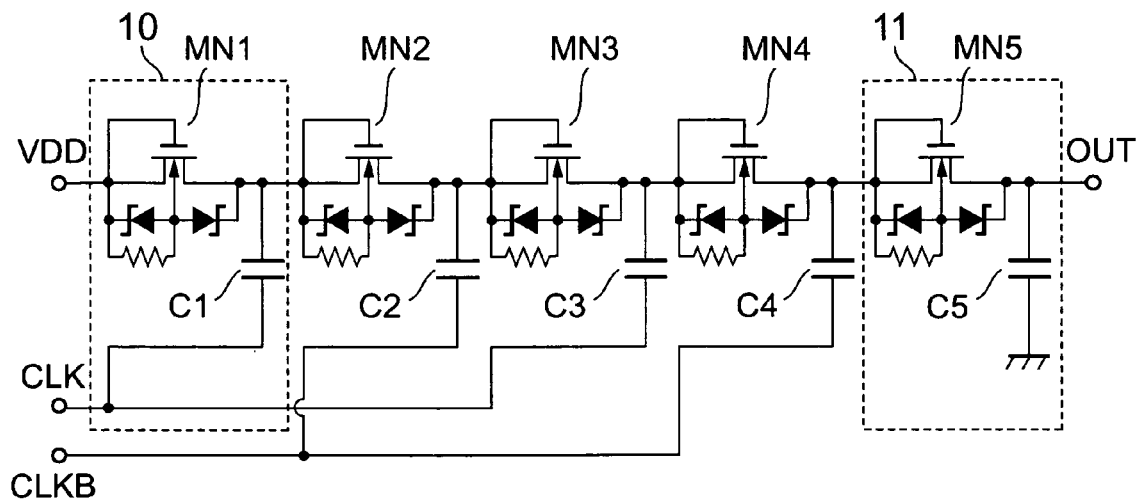
FIG. 10 is a charge pump circuit diagram according to a sixth embodiment of the present invention.

FIG. 10 shows a boosting charge pump circuit according to a sixth embodiment of the present invention. The difference between FIGS. 10 and 4 is that a resistor has been inserted-between the well and the connection point between the gate and the drain. In FIG. 4, the potential in the well is determined by causing the leakage current in the drain-side Schottky barrier diode to flow in the source-side Schottky barrier diode when the voltage VCLK is in the "L" state. In FIG. 10, by contrast, a path is formed by using the resistor to ensure the flow of the current from the drain-side Schottky barrier diode to the source-side Schottky barrier diode, thereby making it possible to reliably turn on the source-side Schottky barrier diode, and reliably bring the well potential to a value obtained by adding about 0.3 V to the source potential when the voltage VCLK is in the "L" state. The effect of the resistor is not limited to the boosting charge pump circuit of FIG. 4. It is obvious that the resistor also achieves the same effect in the boosting charge pump circuit of each of FIGS. 1 and 3.

Embodiment 7

Figure 11:
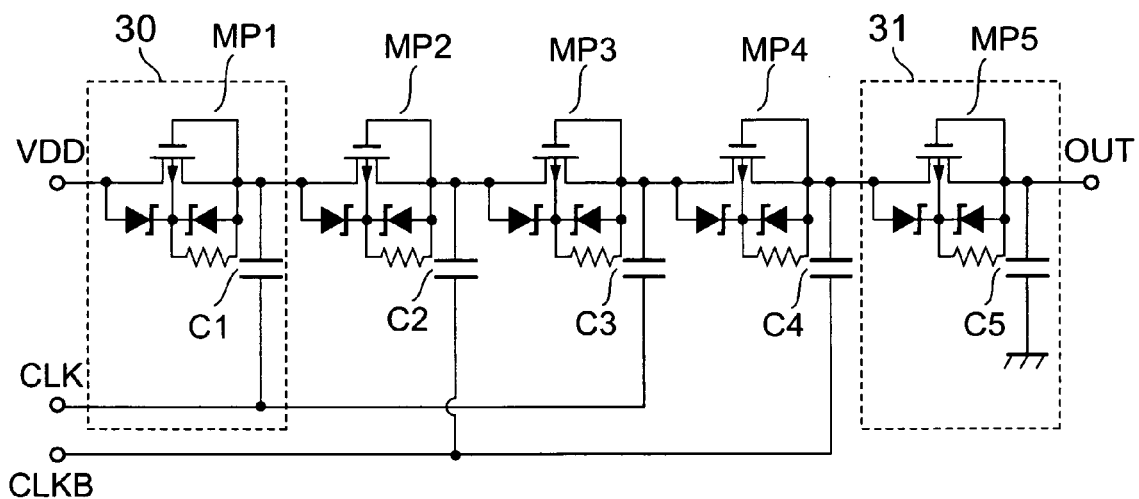
FIG. 11 is a charge pump circuit diagram according to a seventh embodiment of the present invention.

FIG. 11 shows a boosting charge pump circuit according to a sixth embodiment of the present invention. The difference between FIGS. 10 and 8 is that a resistor has been inserted between the well and the connection point between the gate and the drain. In FIG. 8, the potential in the well is determined by causing the leakage current in the drain-side Schottky barrier diode to flow in the source-side Schottky barrier diode when the voltage VCLK is in the "L" state. In FIG. 11, by contrast, a path is formed by using the resistor to ensure the flow of the current from the drain-side Schottky barrier diode to the source-side Schottky barrier diode, thereby making it possible to reliably turn on the source-side Schottky barrier diode and reliably bring the well potential to a value obtained by adding about 0.3 V to the source potential, when the voltage VCLK is in the "L" state. The effect of the resistor is not limited to the boosting charge pump circuit of FIG. 8. It is obvious that the resistor also achieves the same effect in the boosting charge pump circuit of FIG. 6.

Figure 12:
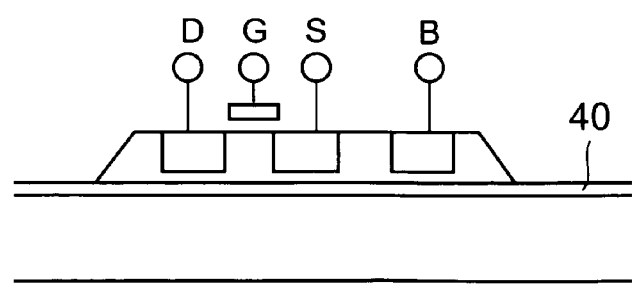
FIG. 12 is a cross-sectional structural view of the MOS transistor on an SOI.

FIG. 12 shows the cross-sectional structure of a MOS transistor formed on an SOI. There is an insulating material 40 (e.g., $SiO_2$) on a support substrate, and the MOS transistor is formed on the insulating material 40. The D, G, S, and B terminals of FIG. 12 respectively represent the terminals of the drain, gate, source, and substrate (well) of the MOS transistor. For example, if the n-channel MOS transistors MN1 to MN5 of FIG. 1 and the p-channel MOS transistors MP1 to MP5 of FIG. 6 are formed on the SOI, even when the parasitic pn-junction diode between the well and the drain or between the well and the source is turned on, a boosting operation is enabled without causing the parasitic bipolar transistor to be turned on, as is observed in the case where the MOS transistors are formed on the bulk.

The effect is not limited to the SOI substrate. It is obvious that the same effect is achievable if the MOS transistors are insulated by using another means including a double well structure.

Figure 15:
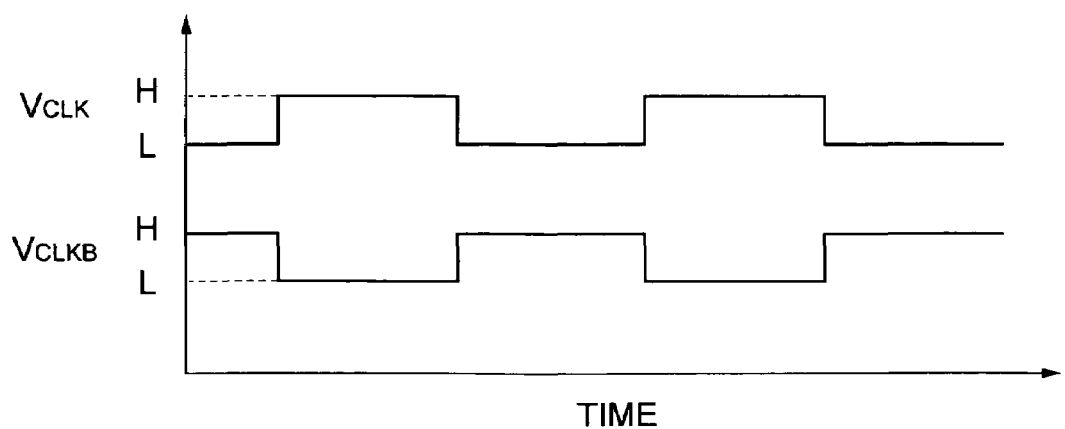
FIG. 15 shows the waveforms of voltages CLK and CLKB.

As is obvious from the fact that an output voltage of the boosting charge pump circuit according to the present embodiment is given by the expressions (10) and (11), the effect of the present invention is enhanced to be maximum when the power source voltage VDD is low and the difference between the power voltage VDD and the threshold voltage of the MOS transistor is small. For example, if the threshold voltage is assumed to be 0.7 V when the power source voltage VDD is 1 V, the output voltage is 5×1–0.7–0.7–0.7–0.7–0.7=1.5 V (actually, in the conventional embodiment shown in FIG. 15, the back-gate bias increases the threshold voltage of the n-channel MOS transistor MN2 to be higher than the threshold voltage of the n-channel MOS transistor MN1, and the threshold voltage of the n-channel MOS transistor MN3 is further increased to be higher than the threshold voltage of the n-channel MOS transistor MN2, so eventually the output voltage is decreased to be lower than 1.5 V). However, when the threshold voltage lowers to 0.5 V due to the forward back-gate bias, the output voltage is 5×1–0.5–0.5–0.5–0.5–0.5=2.5 V.

Although each of the above-mentioned embodiments has described the case where the four unit boosting circuits are provided, the number of the unit boosting circuits is not limited thereto and any number of unit boosting circuits may be provided in the present invention. In addition, although the input terminal of the first unit boosting circuit is connected to the power source, it need not be connected directly to the power source. For example, the input terminal of the first unit boosting circuit may also be connected to the power source via the switch element of a MOS transistor.

Embodiment 8

Figure 13:
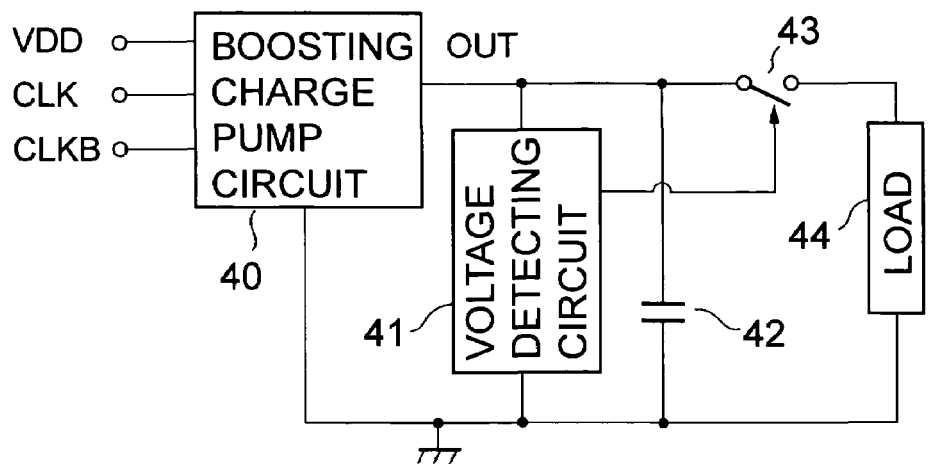
FIG. 13 is a charge pump circuit diagram according to an eighth embodiment of the present invention.

FIG. 13 shows a boosting charge pump circuit according to an eighth embodiment of the present invention. A boosting charge pump circuit 40 comprises a VDD terminal to which a power source is connected and CLK and CLKB terminals to which clocks are connected. To the output OUT of the boosting circuit 40, a circuit 41 for detecting the voltage of the output OUT, a capacitor 42, and a switch element 43 are connected. The switch element 43 has the other terminal thereof connected to a load 44. The voltage detecting circuit 41 detects the voltage of the boosting circuit when it exceeds an arbitrary value and turns on the switch element 43. When the switch element 43 is turned on, the load 44 is connected to the output OUT of the boosting circuit 40. The switch element 43 is composed of a MOS transistor and the on/off operation thereof is controlled by a voltage outputted from the voltage detecting circuit 41.

In the conventional embodiment, the load has been connected directly to the output of the boosting circuit. In that state, however, there are cases where a sufficient boosted voltage can not be obtained when the boosting ability of the boosting circuit 40 is poor. For example, when the boosting ability of the boosting circuit is only 1 MA relative to a given boosted voltage and when 1 MA or more is consumed as the load, the boosting circuit cannot boost a voltage to the desired level of a boosted voltage. However, as shown in FIG. 13, if the boosting circuit 40 and the load 44 are separated from each other by using the switch element 43 and the switch element 43 is turned off, the boosting circuit 40 can reliably boost the voltage till it reaches the desired level of the voltage irrespective of the magnitude of the load 44. The voltage detecting circuit 41 detects that the output OUT of the boosting circuit 40 has reached the desired voltage and turns on the switch element 43, whereby the desired voltage is applied successfully to the load 44.

Since the boosting circuit does not have an inherent boosting ability to continuously drive the load while maintaining the desired voltage, the time period during which the desired voltage can be applied to the load 44 is determined by the respective values of the capacitor 42 and the load 44. However, if it is unnecessary to continuously drive the load 44, it is possible to temporarily drive a load which overweighs the boosting ability even though the boosting ability of the boosting circuit is low. The circuit is particularly effective at the time of a low power source voltage when the boosting ability decreases.

What is claimed is:

1. A boosting charge pump circuit comprising:
a plurality of unit boosting circuits each composed of: a first n-channel MOS transistor using one terminal thereof connected to a gate as an input terminal and using the other terminal thereof as an output terminal; and a capacitor having one terminal thereof connected to the output terminal of the first n-channel MOS transistor, wherein
clock signals having opposite phases are inputted to each of the other terminals of the capacitors of adjacent two of the unit boosting circuits, and
a potential in a well of the first n-channel MOS transistor is given by a source-well parasitic diode and by a drain-well parasitic diode.

2. A boosting charge pump circuit according to claim 1, wherein the unit boosting circuit in a final stage is a boosting output circuit having the other terminal of the capacitor thereof connected to GND.

3. A boosting charge pump circuit according to claim 1, wherein the first n-channel MOS transistor of at least one of the unit boosting circuits is provided with at least one of a first Schottky barrier diode and a second Schottky barrier diode; the first Schottky barrier diode having an anode connected to the well of the first n-channel MOS transistor and a cathode connected to the output terminal, the second Schottky barrier diode having an anode connected to the well of the first n-channel MOS transistor and a cathode connected to the input terminal.

4. A boosting charge pump circuit according to claim 1, wherein at least a part of each of the unit boosting circuits or at least a part of the boosting output circuit is formed on an SOI substrate.

5. A boosting charge pump circuit according to claim 1, wherein a power source voltage is 1 V or less.

6. A charge pump circuit comprising:
a boosting circuit;
a capacitor connected between an output of the boosting circuit and a ground (GND);
a voltage detecting circuit for detecting an output voltage of the boosting circuit; and
a switch element for providing connection between the output of the boosting circuit and a load, wherein
the boosting circuit is a boosting charge pump circuit according to claim 1 and turns on the switch element when the voltage detecting circuit detects that the output voltage of the boosting circuit exceeds an arbitrary value.

7. A boosting charge pump circuit according to claim 2, wherein
a second n-channel MOS transistor is provided between the well of the first n-channel MOS transistor and the GND, and
in-phase clock signals are inputted to the gate of the second n-channel MOS transistor and to the other terminal of the capacitor to cause voltage boosting.

8. A boosting charge pump circuit according to claim 2, wherein a resistor is provided at least between the well of the first n-channel MOS transistor and the input terminal, or between the well of the first n-channel MOS transistor and the output terminal.

9. A boosting charge pump circuit according to claim 3, wherein the unit boosting circuit in a final stage is a boosting output circuit having the other terminal of the capacitor thereof connected to GND.

10. A boosting charge pump circuit according to claim 9, wherein
a second n-channel MOS transistor is provided between the well of the first n-channel. MOS transistor and the GND, and
in-phase clock signals are inputted to the gate of the second n-channel MOS transistor and to the other terminal of the capacitor to cause voltage boosting.

11. A boosting charge pump circuit according to claim 9, wherein a resistor is provided at least between the well of the first n-channel MOS transistor and the input terminal, or between the well of the first n-channel MOS transistor and the output terminal.

12. A boosting charge pump circuit comprising:
a plurality of unit boosting circuits each composed of: a first p-channel MOS transistor using one terminal connected to a gate as an output terminal and using the other terminal as an input terminal; and a capacitor having one terminal connected to the output terminal of the first p-channel MOS transistor, wherein
clock signals having opposite phases are inputted to each of the other terminals of the capacitors of adjacent two of the unit boosting circuits and
a potential in a well of the first p-channel MOS transistor is given by a source-well parasitic diode and by a drain-well parasitic diode.

13. A boosting charge pump circuit according to claim 12, wherein the unit boosting circuit in a final stage is a boosting output circuit having the other terminal of the capacitor thereof connected to a ground (GND).

14. A boosting charge pump circuit according to claim 12, wherein the first p-channel MOS transistor of at least one of the unit boosting circuits is provided with at least one of a first Schottky barrier diode and a second Schottky barrier diode, the first Schottky barrier diode having an anode connected to the well of the first n-channel MOS transistor and a cathode connected to the output terminal, the second Schottky barrier diode having an anode connected to the well of the first n-channel MOS transistor and a cathode connected to the input terminal.

15. A boosting charge pump circuit according to claim 12, wherein at least a part of each of the unit boosting circuits or at least a part of the boosting output circuit is formed on an SOI substrate.

16. A boosting charge pump circuit according to claim 12, wherein a power source voltage is 1 V or less.

17. A charge pump circuit comprising:
a boosting circuit;
a capacitor connected between an output of the boosting circuit and a ground (GND);

a voltage detecting circuit for detecting an output voltage of the boosting circuit; and a switch element for providing connection between the output of the boosting circuit and a load, wherein the boosting circuit is a boosting charge pump circuit according to claim 12 and turns on the switch element when the voltage detecting circuit detects that the output voltage of the boosting circuit exceeds an arbitrary value.

18. A boosting charge pump circuit according to claim 13, wherein a resistor is provided at least between the well of the first p-channel MOS transistor and the input terminal or between the well of the first p-channel MOS transistor and the output terminal.

19. A boosting charge pump circuit according to claim 14, wherein the unit boosting circuit in a final stage is a boosting output circuit having the other terminal of the capacitor thereof connected to GND.

20. A boosting charge pump circuit according to claim 19, wherein a resistor is provided between the well of the first p-channel MOS transistor and the input terminal, or between the well of the first p-channel MOS transistor and the output terminal.

* * * * *